United States Patent [19]
Imoto

[11] Patent Number: 5,920,781
[45] Date of Patent: Jul. 6, 1999

[54] METHOD OF MAKING SEMICONDUCTOR DEVICE

[75] Inventor: Shinya Imoto, Kyoto, Japan

[73] Assignee: Rohm Co., Ltd., Kyoto, Japan

[21] Appl. No.: 08/951,572

[22] Filed: Oct. 16, 1997

[30]  Foreign Application Priority Data

Oct. 18, 1996 [JP] Japan ................................. 8-275632

[51] Int. Cl.$^6$ ................................................ H01L 21/336
[52] U.S. Cl. ........................... 438/301; 438/978; 438/701
[58] Field of Search ................................... 438/301, 302,
438/306, 307, 673, 978, 260, 263, 264,
305, 640, 701, 713; 148/DIG. 161

[56]  References Cited

U.S. PATENT DOCUMENTS

| | | | |
|---|---|---|---|
| 4,282,646 | 8/1981 | Fortino et al. .......................... | 438/306 |
| 4,420,871 | 12/1983 | Scheibe .................................... | 438/264 |
| 4,558,338 | 12/1985 | Sakata ...................................... | 438/301 |
| 4,599,118 | 7/1986 | Han et al. ................................ | 438/307 |
| 4,603,472 | 8/1986 | Schwabe et al. ........................ | 438/303 |
| 4,914,047 | 4/1990 | Seki .......................................... | 438/306 |
| 5,427,971 | 6/1995 | Lee et al. ................................. | 438/305 |
| 5,514,611 | 5/1996 | Kim et al. ................................ | 438/306 |

FOREIGN PATENT DOCUMENTS 8-241889  9/1996  Japan .

*Primary Examiner*—Charles Bowers
*Assistant Examiner*—Jack Chen
*Attorney, Agent, or Firm*—Majestic, Parsons, Siebert & Hsue P.C.

[57]  ABSTRACT

A semiconductor device with a longer channel length is made by first forming an insulating film over a semiconductor substrate, next forming on this insulating film an electrode having a main part and side parts which are thinner than the main part and may each have a tapered surface, then doping a surface of the semiconductor substrate by using the electrode as a mask and by ion-implanting impurities towards surfaces of the insulating film and the electrode through these side parts, and carrying out an annealing process and thereby causing the impurities to diffuse.

2 Claims, 5 Drawing Sheets

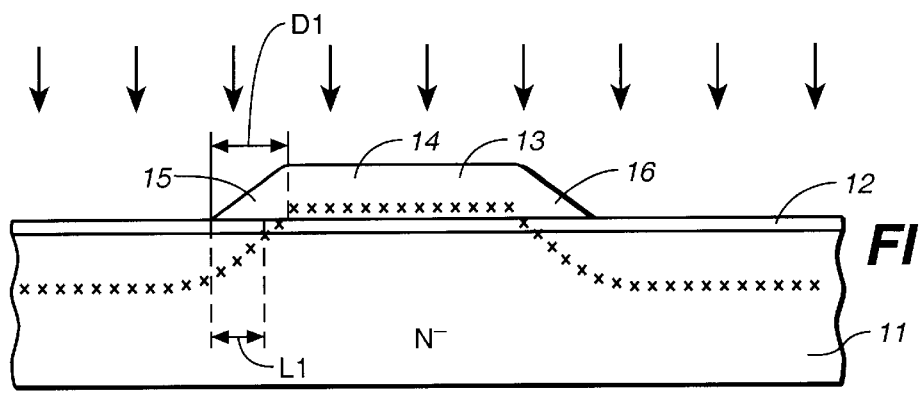
FIG._1A
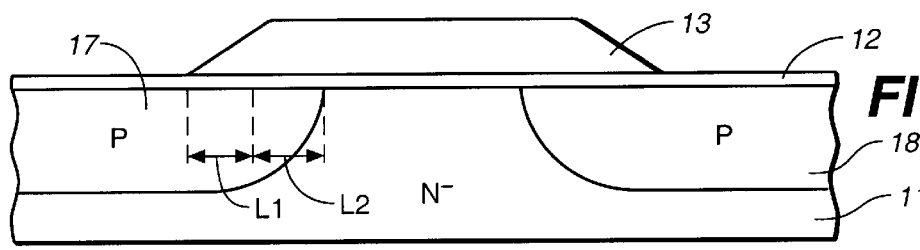
FIG._1B
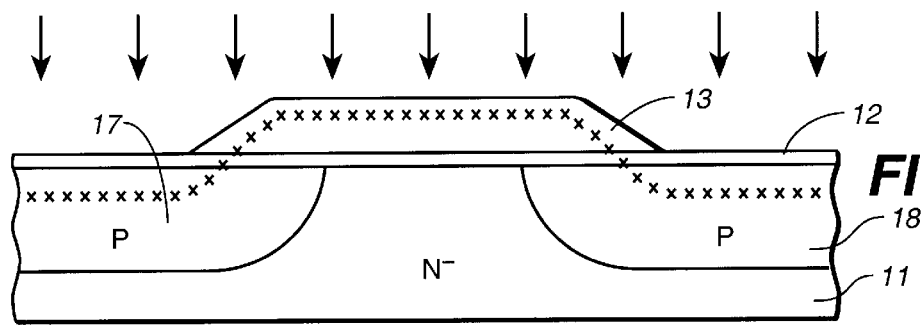
FIG._1C
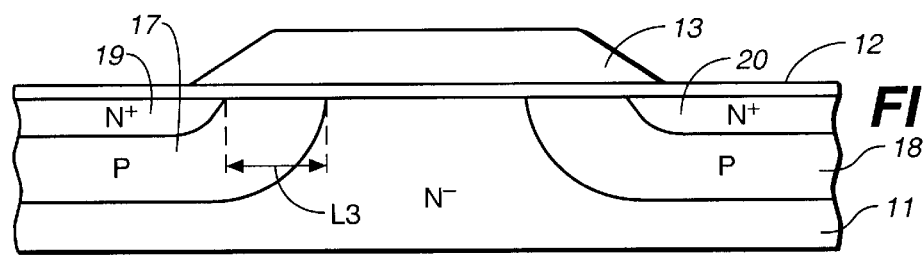
FIG._1D

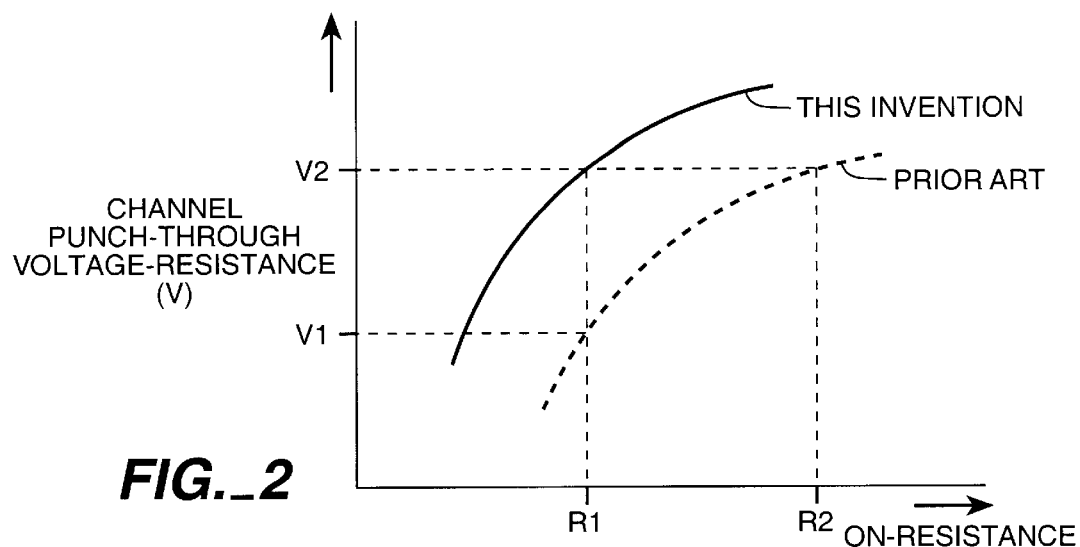
FIG._2
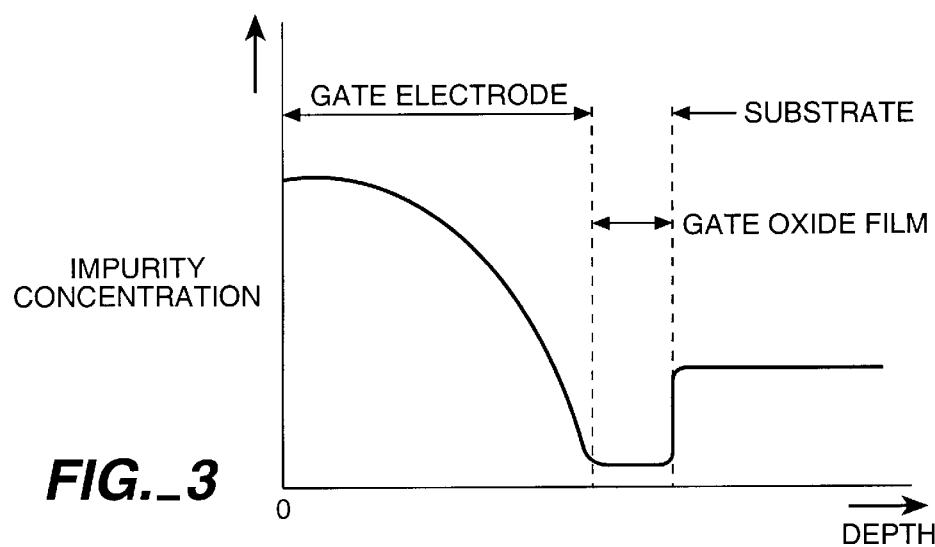
FIG._3
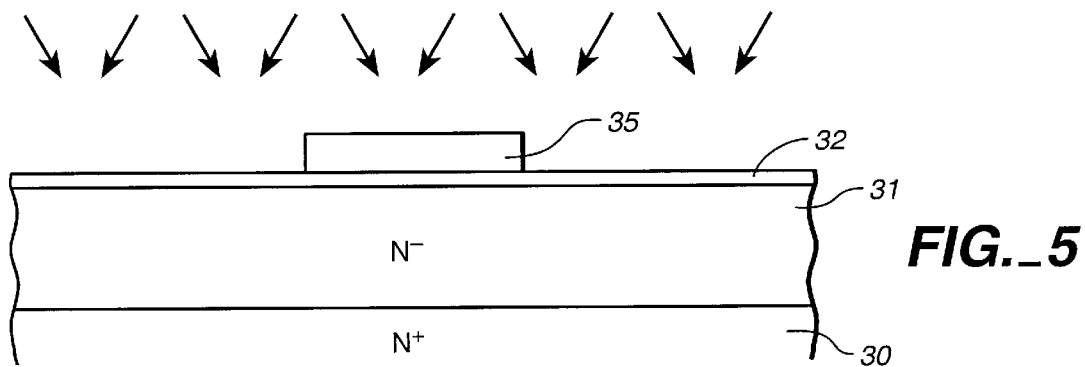
FIG._5

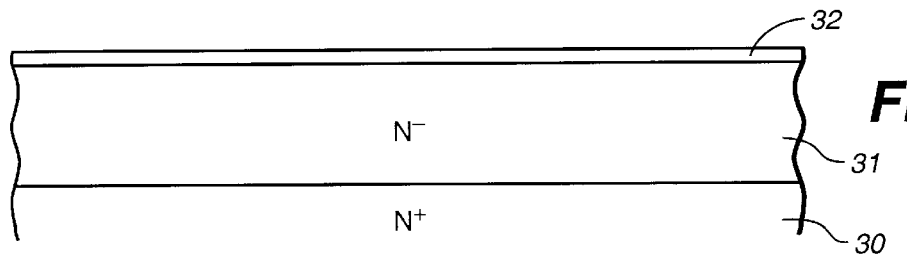
FIG._4A
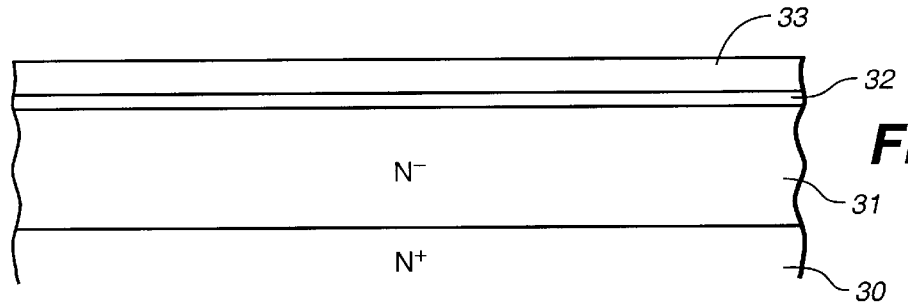
FIG._4B
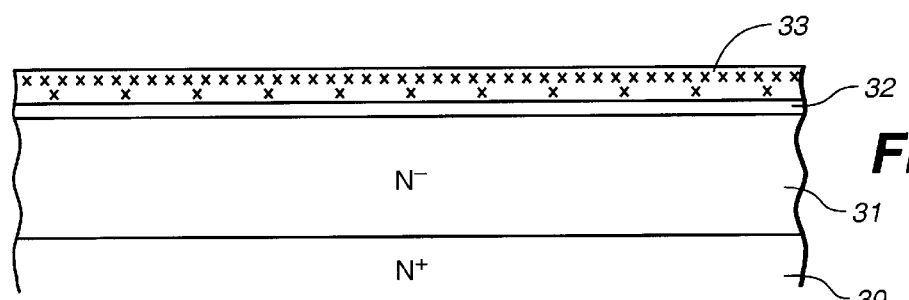
FIG._4C
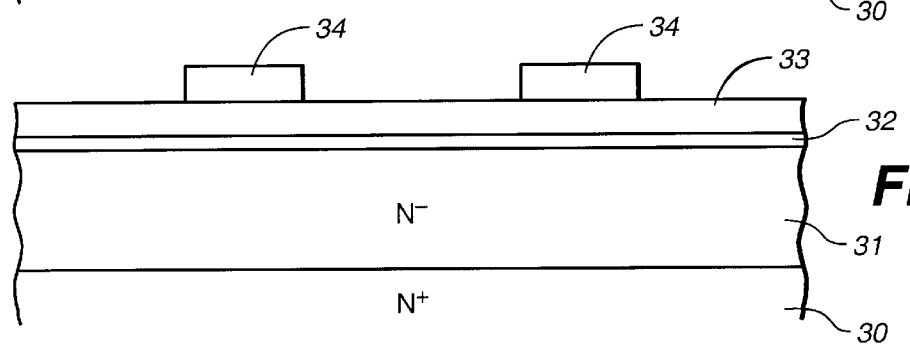
FIG._4D
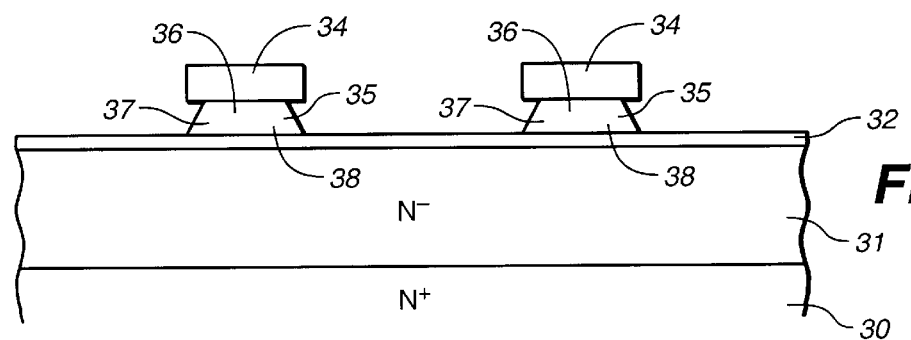
FIG._4E

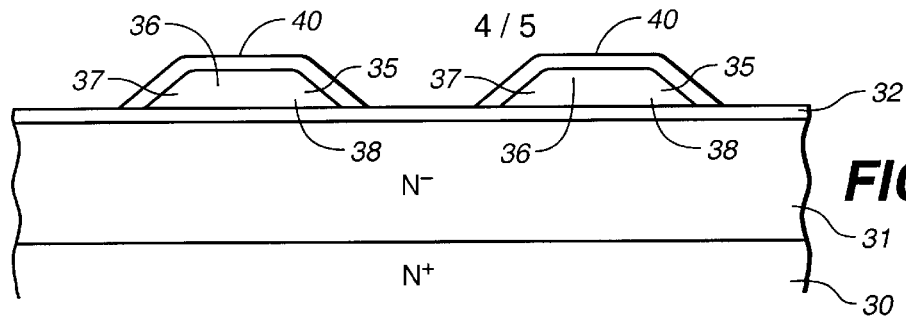
FIG._4F
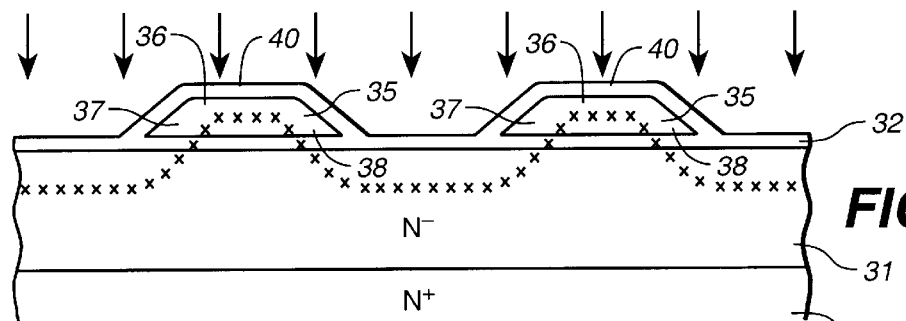
FIG._4G
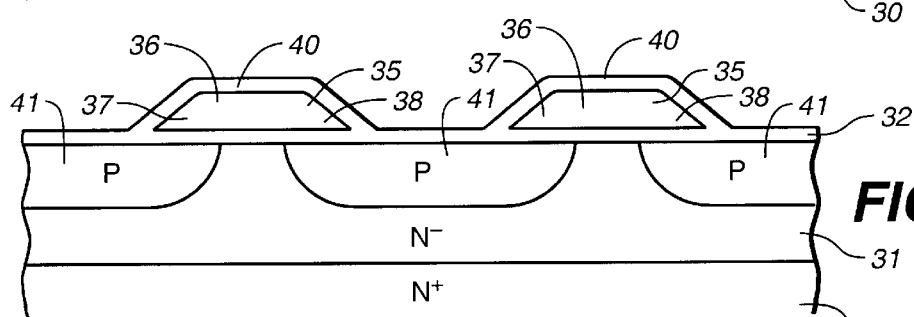
FIG._4H
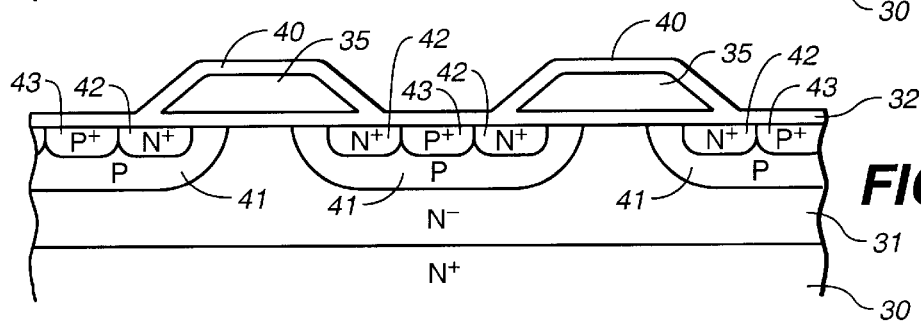
FIG._4I
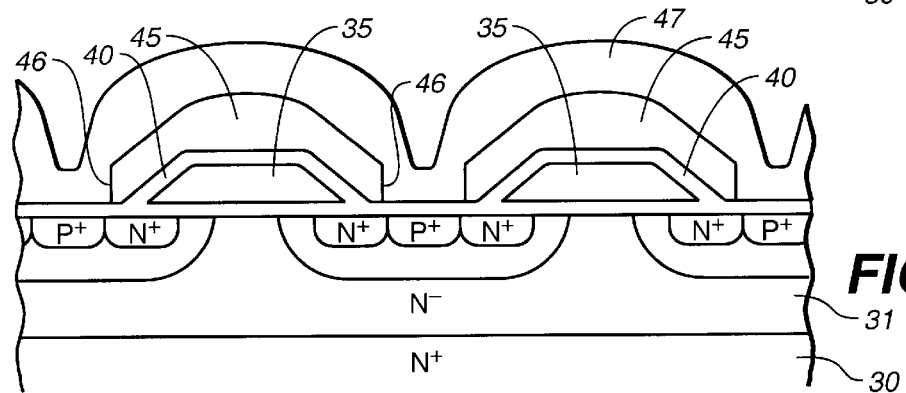
FIG._4J

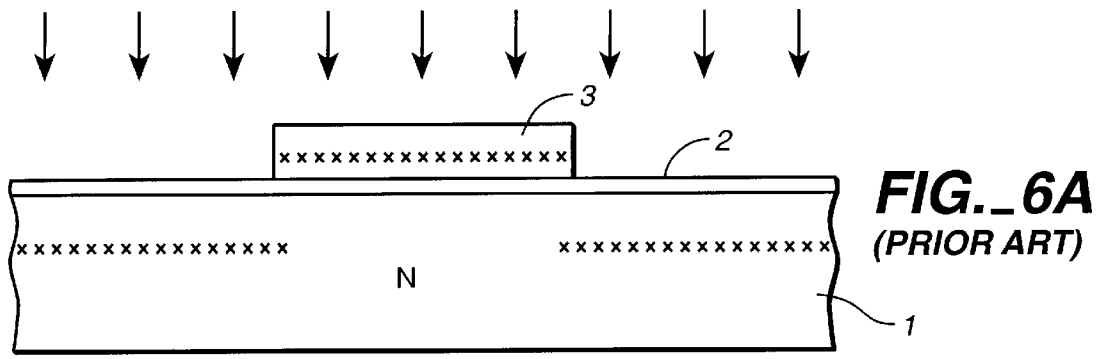
FIG._6A
*(PRIOR ART)*
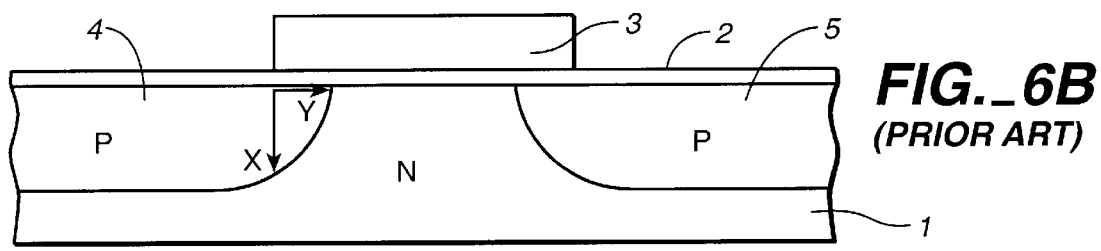
FIG._6B
*(PRIOR ART)*
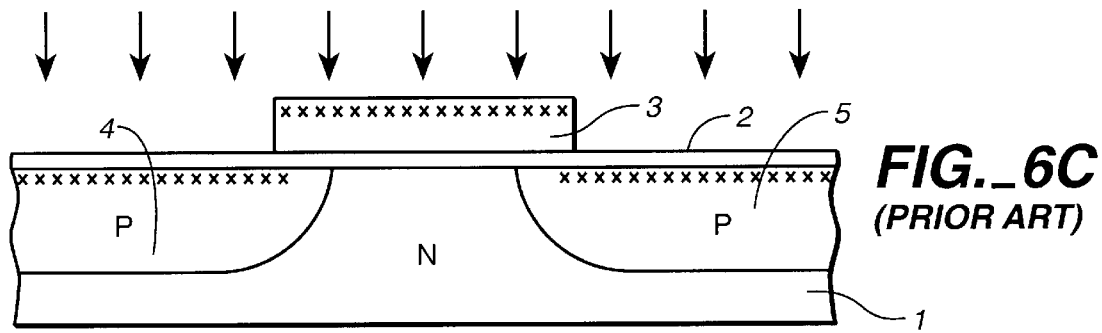
FIG._6C
*(PRIOR ART)*
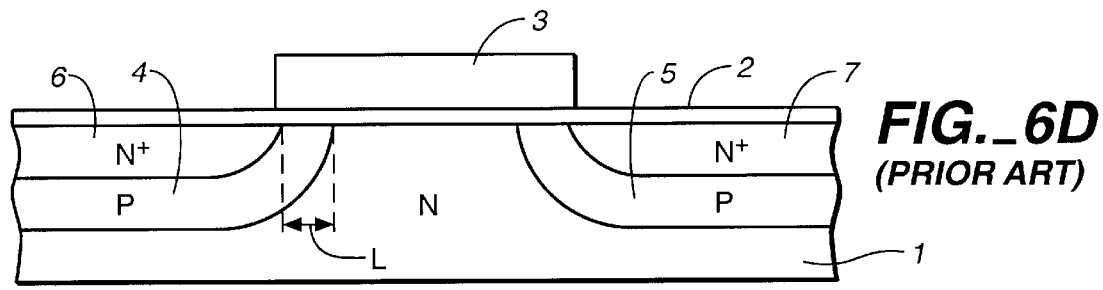
FIG._6D
*(PRIOR ART)*

METHOD OF MAKING SEMICONDUCTOR DEVICE

BACKGROUND OF THE INVENTION

This invention relates to a method of making a semiconductor device such as a double diffused MOS transistor.

According to a prior art method of making an N-channel double diffused MOS transistor, as shown in FIGS. 6A–6D (summarily referred to as FIG. 6), a gate oxide film 2 is formed first on an N-type silicon substrate 1 and a gate electrode 3 made of poly-crystalline silicon is then formed on this gate oxide film 2. A doping process is carried out thereafter, as shown in FIG. 6A, by using this gate electrode 3 as a mask and implanting P-type impurities such as boron by an ion implantation method. In the figure, the implanted dopant is indicated by "x." Next, the impurities are driven in by an annealing process, as shown in FIG. 6B, and P-type diffusion areas 4 and 5 are formed by using the gate electrode 3 as a mask for self-alignment. There are usually large differences in the dimension of such diffusion areas 4 and 5 in the (vertical) direction of depth and the (horizontal) direction of extension. The depth x and the horizontal extension y are usually in an approximate relationship of x:y=1:0.7–0.8. Next, another doping process is carried out again by using the gate electrode 3 as a mask and implanting N-type impurities such as arsenic or phosphorus by an ion implantation method, as shown in FIG. 6C. Next, these impurities are driven in, as shown in FIG. 6D, by an annealing process. N-type diffusion areas are thus formed inside the P-type diffusion areas 4 and 5 to become sources 6 and 7 by using the gate electrode 3 as a mask for self-alignment. At the same time, the P-type diffusion areas 4 and 5 become channel regions. The difference in the distance between the P-type diffusion area 4 (or 5) and the source 6 (or 7), thus formed, becomes the channel length L.

In order to improve the characteristics of such a MOS transistor, it is required to reduce its threshold voltage. The threshold voltage can generally be made smaller by reducing the impurity concentration in the channel region and also by making the gate oxide film thinner. If the impurity concentration in the channel regions is made smaller, however, the so-called punch-through phenomenon is likely to occur whereby adjacent hollow regions extend and strike each other, and this will have the consequence of adversely affecting the voltage-resistance of the transistor. In order to prevent the voltage-resistance from becoming adversely affected by the punch-through phenomenon caused by a drop in the impurity concentration in the channel region, one may think of making the channel length longer but the process of driving in ions will have to be carried out at a higher temperature and for a longer period of time in order to increase the channel length. If the drive-in process is carried out at a high temperature and for a longer period of time, however, the impurities which have been implanted into the polysilicon gate electrode at a high concentration may pass through the gate oxide film and reach the side of the silicon substrate. Such penetration of the impurities to the side of the silicon substrate has the effect of adversely affecting the general characteristics of the transistor element itself.

In summary, the drive-in process for channel diffusion must be carried out at a high temperature for a longer period of time, while the impurity concentration in the channel regions is kept low, in order to make the threshold voltage lower without lowering the voltage-resistance caused by punch-through, but such a process leads to the problem of impurities of the polysilicon reaching the silicon substrate as a result of the drive-in process at a high temperature over a long period of time.

SUMMARY OF THE INVENTION

It is therefore an object of this invention to provide a method of producing a semiconductor device by which the horizontal length of the diffusion area formed directly under the electrode can be made longer without carrying out a drive-in process at a high temperature over a long period.

A method embodying this invention, by which the above and other objects can be accomplished, may be characterized as comprising the steps of forming an insulating film over a semiconductor substrate, forming on this insulating film an electrode having a thicker main part sandwiched between thinner side parts, doping a surface of the semiconductor by using the electrode as a mask and by ion-implantation of impurities towards surfaces of the insulating film and the electrode through these side parts, and carrying out an annealing process and thereby causing diffusion of the impurities. The side parts may be formed such that their thickness decreases as the distance from the main part increases. They may be formed so as to have a tapered surface. According to another method embodying this invention, the electrode is formed without any side parts which are made thinner than the main part but impurities are injected obliquely at least through the side end parts of the electrode.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIGS. 1A, 1B, 1C and 1D (together referred to as FIG. 1) are schematic sectional views for showing a method, according to a first embodiment of this invention, of making a semiconductor device;

FIG. 2 is a graph which shows the relationship between the ON-resistance and punch-through voltage-resistance;

FIG. 3 is a graph which shows the distribution of impurity concentration in the gate electrode;

FIGS. 4A, 4B, 4C, 4D, 4E, 4F, 4G, 4H, 4I and 4J (together referred to as FIG. 4) are schematic sectional diagrams for showing in detail a method according to this invention of making an N-channel double diffused MOS transistor;

FIG. 5 is a schematic sectional view for showing another method according to this invention; and FIGS. 6A, 6B, 6C and 6D (together referred to as FIG. 6) are schematic sectional views for showing a prior art method of making a semiconductor device.

DETAILED DESCRIPTION OF THE INVENTION

In a method of making an N-channel double diffused MOS transistor according to a first embodiment of this invention, a polysilicon gate electrode 13 is formed on a gate oxide film 12 which is formed on an N-type silicon substrate 11. This gate electrode 13 comprises a main part 14 which is in the middle and side parts 15 and 16 which are at both sides of the main part 14 and are tapered so as to be thinner as the distance from the main part 14 increases. Next, as shown in FIG. 1A, P-type implantations such as boron are injected as a dopant by an ion implantation process. The distribution of the peak impurity concentration is shown by "x" in the figure. In carrying out this process, the injection energy of the ions is set relatively high such that those of the impurities ion-implanted through the side parts 15 and 16 of the gate electrode 13 are driven into the substrate 11 by penetrating the side parts 15 and 16 but that those injected towards the main part 14 will remain inside the main part 14. In other words, the main part 14 of the gate electrode 13 is made to serve as a mask for the ion implantation process. Since the gate electrode 13 is thinner at the side parts 15 and 16, the ion-implanted impurities can penetrate the gate electrode 13 more easily through its side parts 15 and 16 although they are implanted uniformly.

FIG. 1A shows that the distribution of the implanted impurities directly under the side parts 15 and 16 is such that its horizontal width L1 is slightly smaller than the horizontal width D1 of the side part 15. FIG. 1A also shows that the impurities are driven more deeply into the substrate 11 at distances farther away from the main part 14 because the side parts 15 and 16 are tapered such that its thickness gradually decreases as the distance from the main part 14 increases.

Next, an annealing process is carried out, and the impurities are driven in (or redistributed) so as to form P-type diffusion areas 17 and 18, as shown in FIG. 1B. The diffusion area, thus resulting from this process, extends farther by an extra distance L2 horizontally from the original width L1.

Thereafter, as shown in FIG. 1C, N-type impurities such as arsenic or phosphorus are again ion-implanted by using the gate electrode as a mask. This ion-implantation process is carried out, however, at a relatively low energy such that those of the impurities injected towards the side parts 15 and 16, as well as those injected towards the main part 14, will not penetrate the gate electrode 13 but will remain therein. Next, another annealing process is carried out whereby the impurities are driven in (or redistributed), as shown in FIG. 1D, such that the N-type diffusion regions 19 and 20 are formed inside the P-type diffusion areas 17 and 18 to become sources and the P-type diffusion areas 17 and 18 become channel regions.

With reference now to FIG. 1D, the difference in distance L3 between the P-type diffusion area 17 (or 18) and the source 19 (or 20) becomes the channel length of the channel region. As can be understood from the description given above, the channel length can be made longer according to this invention by distance L1 corresponding to the side parts 15 and 16, and this can be accomplished without carrying out a drive-in process at a high temperature over an extended period of time. As the channel length is increased, the threshold voltage can be reduced and the characteristics of the MOS transistor can be improved because the impurity concentration in the channel regions can be lowered without making the punch-through voltage-resistance lower.

Since the channel length can be increased according to this invention without carrying out a drive-in process at a high temperature over an extended period of time, furthermore, penetration of impurities from the gate electrode to the side of the silicon substrate can be prevented, and this means that the characteristics of the transistor element is not adversely affected. This also means that there is no need to make the gate oxide film thicker in order to prevent the penetration of the impurities. Thus, the gate oxide film can be made thin and this makes it easier to make the threshold voltage lower and to improve the characteristics of the MOS transistor.

Because the channel length can be increased and the punch-through voltage-resistance can be prevented from becoming lower, not only can the impurity concentration in the channel regions and the threshold voltage be made smaller but also the ON-resistance can be made smaller. FIG. 2 is a graph for showing the relationship between the ON-resistance and the punch-through voltage-resistance. In FIG. 2, the solid curve shows a characteristic according to this invention, the broken line representing a characteristic according to a prior art technology. Suppose that a punch-through voltage-resistance V2 is desired. FIG. 2 then shows that the ON-resistance would be R2 according to the prior art technology but that the ON-resistance according to this invention can be R1 which is smaller than R2 because the channel length can be made longer to prevent the occurrence of punch-through although the impurity concentration in the channel regions is reduced.

In other words, if ON-resistance of magnitude R1 is to be obtained by the prior art technology, the impurity concentration in the channel regions had to be lowered, and this caused the punch-through voltage-resistance to be V1 which is lower than V2. According to the present invention, on the other hand, the punch-through voltage resistance can be kept at V2 by making the channel length longer, although the impurity concentration in the channel regions is lowered.

The side parts 15 and 16 of the gate electrode 13 can be formed in a tapered shape, for example, by carrying out isotropic etching such as ordinary isotropic dry etching or wet etching on the polysilicon layer formed on the gate oxide film 12. Since the polysilicon layer used as the gate electrode for a MOS transistor is very thin (several hundred nm), the etching process must be carried out by changing the impurity concentration inside the gate electrode in order to obtain a sufficiently tapered shape. When an isotropic dry etching process is carried out on a polysilicon layer, for example, the impurity concentration of the gate electrode is controlled as shown in FIG. 3 such that it is large near the surface, becoming smaller as the gate oxide film is approached because the etching rate increases as the concentration of the doped impurities increases.

Although the side parts of the gate electrode have been described above as having tapered surfaces, these surfaces are not necessarily required to be tapered but may be cross-sectionally of an arcuated shape or of a shape having steps.

FIG. 4 will be referenced next to explain in detail a method of making an N-channel double diffused MOS transistor embodying this invention.

First, a gate oxide film 32 of thickness about 50 nm is formed, for example, by thermal oxidation of an epitaxial layer 31 formed on an N-type silicon wafer 30, as shown in FIG. 4A. Next, a polysilicon layer 33 is formed on this gate oxide film 32, say, by a CVD method, as shown in FIG. 4B. Next, this polysilicon layer 33 is doped with impurities, as shown in FIG. 4C. Arsenic, phosphorus (N-type) or boron (P-type) may be used as the impurities, and doping is effected such that the impurity concentration is larger near the surface and becomes smaller towards the gate oxide film 32. Next, a photoresist 34 is formed over the polysilicon layer 33, as shown in FIG. 4D, by photolithography. This photoresist 34 is used next as a mask to etch the polysilicon layer 33 by an isotropic etching method such as chemical dry etching to form a gate electrode 35, as shown in FIG. 4E. In this manner, side parts 37 and 38 of the gate electrode 35 are formed in a tapered shape with their thickness decreasing as the distance from the main part 36 of the gate electrode 35 increases.

After an oxide film 40 is formed by thermal oxidation on the gate electrode 35, as shown in FIG. 4F, pre-deposition of boron is effected by an ion implantation method, as shown in FIG. 4G. In this process, those of the impurities injected towards the side parts 37 and 38 will penetrate through the side parts 37 and 38 and will be driven into the substrate, while those of the impurities injected towards the main part 36 of the gate electrode 35 will remain inside the main part 36.

Next, an annealing process is carried out at about 1000–1150° C. to form P-type channel regions 41 by driving in the pre-depositioned boron into the silicon substrate, as shown in FIG. 4H. Next, a selective doping process is carried out by implanting N-type impurities such as arsenic or phosphorus, followed by an annealing process whereby P-type regions 43 for a contact purpose of a source region 42 and channel regions 41 are formed, as shown in FIG. 4I.

Finally, as shown in FIG. 4J, insulating films 45 are formed between layers, say, by a PECVD method. After a contact holes 46 are formed, a metallic line 47, say, of aluminum, is provided.

Although the invention has been described above with reference to only one example, this is not intended to limit the scope of the invention. Many modifications and variations are possible within the scope of this invention. For example, although a gate elecltrode with side parts having tapered surfaces was disclosed above, the side parts of the gate electrode 35 may be formed to have vertical edge surfaces, with the ion implantation carried out obliquely according to the so-called angle implant method, as shown in FIG. 5, such that the impurities will pass through the both side end parts of the gate electrode. Alternatively, an angle-implant method may be used against a gate electrode with side parts having tapered surfaces.

In summary, the present invention makes it possible to increase the length of diffusion areas formed by using an electrode as a mask without going through an annealing process at a high temperature over an extended period of time. If a method according to this invention is used to manufacture DMOS transistors, for example, it is possible to increase the channel length of channel regions formed by using electrodes as a mask. As the channel length is increased, the concentration in the channel region can be reduced without lowering the punch-through voltage-resistance and hence the threshold voltage can be reduced and the characteristics of MOS transistors can be improved.

What is claimed is:

1. A method of making a semiconductor device, said method comprising the steps in sequence of:

forming an insulating film over a semiconductor substrate;

forming on said insulating film an electrode having a main part and side parts which are thinner than said main part, becoming thinner as the distance from said main part increases;

droping a surface of said semiconductor substrate by using said main part of the electrode as a mask and by ion-implanting impurities of P-type towards surfaces of said insulating film and said electrode through said side parts and not through said main part, thereby forming channel regions;

carrying out an annealing process and thereby causing diffusion of said impurities of P-type; and ion-implanting impurities of N-type by using said electrode as a mask at a energy level so as not to penetrate said electrode through said side parts and said main part, thereby forming source regions.

2. The method of claim 1 wherein each of said side parts has a tapered surface.

* * * * *